(12) United States Patent
Matsuo et al.

(10) Patent No.: US 6,933,205 B2
(45) Date of Patent: Aug. 23, 2005

(54) INTEGRATED CIRCUIT DEVICE AND METHOD OF MANUFACTURING THE SAME

(75) Inventors: Mie Matsuo, Kamakura (JP); Nobuo Hayasaka, Yokosuka (JP); Noriaki Matsunaga, Chigasaki (JP); Katsuya Okumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/298,059

(22) Filed: Nov. 18, 2002

(65) Prior Publication Data

US 2003/0067052 A1 Apr. 10, 2003

Related U.S. Application Data

(62) Division of application No. 09/605,433, filed on Jun. 29, 2000, now Pat. No. 6,504,227.

(30) Foreign Application Priority Data

Jun. 30, 1999 (JP) .............................................. 11-185119
Jun. 23, 2000 (JP) ...................................... 2000-189937

(51) Int. Cl.[7] .............................................. H01L 21/76
(52) U.S. Cl. ........................ 438/406; 438/779; 438/957
(58) Field of Search ........................ 438/406, 779–783, 438/957, 210, 238–239, 243, 253–254, 396, 479

(56) References Cited

U.S. PATENT DOCUMENTS

| | | | |
|---|---|---|---|
| 4,942,364 A | | 7/1990 | Nishijima et al. |
| 5,446,309 A | | 8/1995 | Adachi et al. |
| 5,539,241 A | | 7/1996 | Abidi et al. |
| 5,559,349 A | * | 9/1996 | Cricchi et al. ............... 257/273 |
| 5,670,387 A | * | 9/1997 | Sun ............................. 438/155 |
| 5,742,091 A | | 4/1998 | Hebert |
| 5,844,299 A | | 12/1998 | Merrill et al. |
| 5,877,533 A | | 3/1999 | Arai et al. |
| 5,883,335 A | | 3/1999 | Mizumoto et al. |
| 5,898,223 A | | 4/1999 | Frye et al. |
| 5,977,845 A | | 11/1999 | Kitahara |
| 6,002,161 A | | 12/1999 | Yamazaki |
| 6,108,212 A | | 8/2000 | Lach et al. |
| 6,170,154 B1 | * | 1/2001 | Swarup ....................... 29/830 |
| 6,180,995 B1 | | 1/2001 | Hebert |
| 6,258,688 B1 | | 7/2001 | Tsai |
| 6,287,931 B1 | | 9/2001 | Chen |
| 6,331,722 B1 | * | 12/2001 | Yamazaki et al. .......... 257/347 |

FOREIGN PATENT DOCUMENTS

| | | | | |
|---|---|---|---|---|
| EP | 0694932 A1 | * | 1/1996 | ........... H01F/17/00 |
| JP | 59076455 A | | 5/1984 | |
| JP | 10284694 A | * | 10/1998 | ........... H01L/27/04 |

OTHER PUBLICATIONS

Yoshimi Hisatsune et al., "Semiconductor Device, Its Manufacturing Process, Position Matching Mark, Pattern Forming Method and Pattern Forming Device," 09/606,152, filed Jun. 29, 2000.

Chang et al., "Large Suspended Inductors on Silicon and Their Use in a 2-micon CMOS RF Amplifier," IEEE Electron Device Letters, vol. 14, No. 5, May 1993, pp. 246–248.

* cited by examiner

*Primary Examiner*—Hoai Pham
*Assistant Examiner*—Ginette Peralta
(74) *Attorney, Agent, or Firm*—Finnegan, Henderson, Farabow, Garrett & Dunner, L.L.P.

(57) ABSTRACT

The present invention provides an integrated circuit, comprising a semiconductor substrate, an active element formed on the side of one main surface of the semiconductor substrate, an insulating region formed on the side of the main surface of the semiconductor substrate by burying an insulating material in a groove having a depth of at least 20 μm, and a passive element formed directly or indirectly on the insulating region. It is desirable for the passive element to be an inductor.

12 Claims, 16 Drawing Sheets

INTEGRATED CIRCUIT DEVICE AND METHOD OF MANUFACTURING THE SAME

This is a division of application Ser. No. 09/605,433, Jun. 29, 2000, now U.S. Pat. No. 6,504,227, which is incorporated herein by reference.

CROSS REFERENCE TO RELATED APPLICATIONS

This application is based upon and claims the benefit of priority from the prior Japanese Patent Applications No. 11-185119, filed Jun. 30, 1999; and No. 2000-189937, filed Jun. 23, 2000, the entire contents of which are incorporated herein by reference.

BACKGROUND OF THE INVENTION

The present invention relates to an integrated circuit device, its manufacturing method, a circuit board and a method of manufacturing the same.

A monolithic IC having an active element such as a transistor and a passive element such as a resistor, a capacitor or an inductor integrated on a semiconductor substrate is low in manufacturing cost, permits suppressing the power consumption, and can be miniaturized, and thus, the monolithic IC can be formed as a one chip.

However, where an inductor is formed on a semiconductor substrate, a parasitic capacitance and a parasitic resistance (eddy current loss) are generated between the conductor forming the inductor and the semiconductor substrate. Therefore, in order to obtain an inductor having a high Q factor, it is necessary to lower the parasitic capacitance and the parasitic resistance.

As a method for lowering the parasitic capacitance and the parasitic resistance, proposed is a method of forming an inductor above a groove formed on the surface of a semiconductor substrate. To be more specific, it is proposed in, for example, U.S. Pat. No. 5,539,241, that an inductor is formed in an air-floating wiring structure so as to increase the distance between the inductor and the semiconductor substrate and, thus, to lower the parasitic capacitance and the parasitic resistance.

In the conventional structure exemplified above, however, it was impossible to ensure a sufficient mechanical strength because the inductor is floating in the air.

It is also proposed to form an active element such as a transistor and a passive element such as a capacitor or an inductor on different substrates, followed by bonding these elements by using a bump, as disclosed in, for example, ISSCC98/SESSION 16, DIGEST OF TECHNICAL PAPERS, pp 248–249.

However, the substrate having an active element formed thereon and the substrate having a passive element formed thereon are arranged such that the element-forming surfaces are allowed to face each other. It follows that the semiconductor substrate having, for example, a transistor formed thereon is apart from the inductor by only a distance determined by the bump. As a result, it was difficult to lower sufficiently the influence of the semiconductor substrate having the transistor formed thereon.

Also, a circuit board having a conductive connecting portion formed within an insulating layer is known to the art. In the conventional technology, however, it is difficult to control the shape of the conductive connecting portion, and the step for forming the conductive connecting portion is made complex.

BRIEF SUMMARY OF THE INVENTION

A first object of the present invention is to provide an integrated circuit device having an active element and a passive element formed on a single semiconductor substrate, in which the parasitic capacitance and the parasitic resistance can be lowered sufficiently and a sufficient mechanical strength can be obtained, and a method of manufacturing the particular integrated circuit device.

A second object of the present invention is to provide an integrated circuit device prepared by connecting by a suitable means a semiconductor substrate having an active element formed thereon and another substrate having a passive element formed thereon, in which the influence of the semiconductor substrate can be sufficiently lowered, and a method of manufacturing the particular integrated circuit device.

Further, a third object of the present invention is to provide a circuit board having a conductive connecting portion extending through an insulating layer, in which the shape of the conductive connecting portion can be controlled easily or the process for forming the conductive connecting portion can be simplified, and a method of manufacturing the particular circuit board.

According to a first aspect of the present invention, there is provided an integrated circuit device, comprising a semiconductor substrate, an active element formed on the side of one main surface of the semiconductor substrate, an insulating region formed on the side of the main surface of the semiconductor substrate by burying an insulating material in a groove having a depth of at least 20 $\mu$m, and a passive element formed directly or indirectly on the insulating region.

According to a second aspect of the present invention, there is provided a method of manufacturing an integrated circuit device, comprising forming a groove having a depth of at least 20 $\mu$m on the side of one main surface of a semiconductor substrate; forming an active element on the side of the main surface of the semiconductor substrate; burying an insulating material in the groove to form an insulating region; and forming a passive element directly or indirectly on the insulating region.

In each of the first and second aspects of the present invention, it is desirable for the passive element to be an inductor, particularly, a spiral inductor. It is desirable for the conductive material forming the inductor to contain as a main component Cu, Au, Ag or Al.

According to the first and second aspects of the present invention, an insulating material is buried in a groove having a depth of at least 20 $\mu$m formed on the side of the main surface of the semiconductor substrate, and a passive element is-formed directly or indirectly on the insulating region formed by burying the insulating material. It follows that it is possible to lower sufficiently the parasitic capacitance and the parasitic resistance and to ensure a sufficient mechanical strength.

In the first and second aspects of the present invention, it is desirable to form the groove by an anisotropic etching. It is desirable for the anisotropic etching to be performed by a reactive ion etching, particularly, a high density plasma etching, using a gas containing fluorine. In the present invention, formed is a groove having a depth of at least 20 $\mu$m. By employing the anisotropic etching, it is possible to form a groove having a side wall substantially perpendicular to the substrate. Therefore, even in the case of forming a deep groove having a depth of at least 20 $\mu$m, the area of the groove-forming region can be diminished to a minimum level. Also, since a deep groove having a depth of at least 20 μm is formed, it is desirable for the anisotropic etching rate to be higher than the ordinary etching rate. In the present invention, the etching can be performed at a high etching rate because a reactive ion etching is performed by using a fluorine-containing gas.

In the present invention, it is desirable for the insulating region to be formed by pouring an insulating fluid into the groove, followed by solidifying the insulating fluid. Since a deep groove having a depth of at least 20 μm is formed in the present invention, a long time is required for forming the insulating material if the insulating material is formed by a deposition method. The insulating material can be formed efficiently by burying an insulating fluid in the groove, followed by solidifying the insulating fluid, i.e., by using a coated film.

In the first and second aspects of the present invention, it is desirable for the groove to be formed after formation of the active element. In general, a high temperature of about 1,000° C. is required for forming the active element. Where the active element is formed in advance before formation of the groove, it is possible to use an insulating film, e.g., an organic coated film, having a low resistance to heat as an insulating material buried in the groove so as to form the insulating material efficiently.

According to a third aspect of the present invention, there is provided an integrated circuit device, comprising a first substrate consisting of a semiconductor substrate and having an active element formed on the side of one main surface; a second substrate having a passive element formed on the side of a first main surface and arranged such that a second main surface opposite to the first main surface faces the main surface of the first substrate; and an electrode extending through the second substrate so as to electrically connect the passive element to the active element.

According to a fourth aspect of the present invention, there is provided a method of manufacturing an integrated circuit device, comprising forming an active element on the side of one main surface of a first substrate; forming a passive element on the side of a first main surface of a second substrate; and allowing a second main surface opposite to the first main surface of the second substrate to face the main surface of the first substrate so as to allow the active element and the passive element to be connected to each other via an electrode extending through the second substrate.

In each of the third and fourth aspects of the present invention, it is desirable for the passive element to be an inductor, particularly, a spiral inductor. It is desirable for the conductive material forming the inductor to contain as a main component Cu, Au, Ag or Al.

According to the third and fourth aspects of the present invention, the distance between the semiconductor substrate having the active element formed thereon and the passive element is larger than at least the thickness of the substrate having the passive element formed thereon, making it possible to lower the influence given by the semiconductor substrate having the active element formed thereon to the passive element.

In the third and fourth aspects of the present invention, it is possible to use a semiconductor substrate as the second substrate. In this case, it is desirable for the resistivity of the semiconductor substrate constituting the second substrate to be higher than the resistivity of the semiconductor substrate constituting the first substrate. It is possible to use a high resistivity Si substrate or a GaAs substrate as the semiconductor substrate constituting the second substrate.

In the third and fourth aspects of the present invention, it is also possible to use an insulating substrate as the second substrate. The insulating substrate used in the present invention includes, for example, an insulating resin substrate (organic insulating substrate) such as a polyimide substrate, a BCB (benzocyclobutane) substrate or an epoxy resin substrate, as well as a quartz substrate or a ceramic substrate.

In the third and fourth aspects of the present invention, the electrode extending through the second substrate can be formed by loading a conductive material in a connection hole made through the second substrate. Alternatively, a projection-like electrode formed on the side of the main surface of the first substrate can be used as the electrode extending through the second substrate.

In the third and fourth aspects of the present invention, it is possible for the active element and the passive element to be electrically connected to each other via the electrode extending through the second substrate and a bump connected to the electrode. By forming the bump, the distance between the semiconductor substrate having the active element formed thereon and the passive element is made larger than the sum of the height of the bump and the thickness of the substrate having the passive element formed thereon so as to further diminish the influence given by the semiconductor substrate having the active element formed thereon.

According to the third and fourth aspects of the present invention, it is possible for an insulating material to be loaded between the main surface of the first substrate and the second main surface of the second substrate. Where the warping of the substrate having a passive element formed thereon generates a problem, the problem can be effectively resolved by the loading of the insulating material.

Further, in the third and fourth aspects of the present invention, it is desirable for the inductor to be formed selectively by a plating treatment or by pattering a metal foil.

According to a fifth aspect of the present invention, there is provided a circuit board, comprising an insulating layer, a conductive connecting portion consisting of a conductive material prepared by solidifying a conductive paste having magnetic properties and extending through the insulating layer, and a conductive pattern formed on at least one main surface of the insulating layer and connected to the conductive connecting portion.

According to a sixth aspect of the present invention, there is provided a method of manufacturing a circuit board, comprising forming a pattern of a conductive paste having magnetic properties on a conductive sheet, followed by solidifying the conductive paste to form a conductive connecting portion; forming an insulating layer on that surface of the conductive sheet on which the conductive connecting portion is formed; and forming a conductive pattern by patterning the conductive sheet in a desired shape.

According to the fifth and sixth aspects of the present invention, the conductive paste has magnetic properties, making it possible to form a pattern of the conductive paste accurately as desired by utilizing the magnetic function. It follows that a conductive connecting portion can be formed easily and accurately by a simple step.

According to a seventh aspect of the present invention, there is provided a method of manufacturing a circuit board, comprising forming a resist pattern having an opening on a conductive sheet; selectively forming a conductive connecting portion within the opening by a plating treatment; removing the resist pattern; forming an insulating layer on that surface of the conductive sheet on which the conductive connecting portion is formed; and forming a conductive pattern by patterning the conductive sheet in a desired shape.

According to the seventh aspect of the present invention, a conductive connecting portion is selectively formed by a plating method within an opening, making it possible to form the conductive connecting portion by a simple step and to improve the bonding strength of the conductive connecting portion.

According to the fifth, sixth and seventh aspects of the present invention, it is desirable for the insulating layer to be formed of a composite material containing polyimide. Particularly, it is desirable to use a composite material containing polyimide having a low elastic modulus of less than 10 GPa. By using a composite material containing such a polyimide, an insulating layer having an excellent adhesivity can be formed easily by, for example, a plating treatment without using an adhesive layer, leading to simplification of the manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Some embodiments of the present invention will now be described with reference to the accompanying drawings.
(Embodiment 1)

A first embodiment of the present invention will now be described. This embodiment relates to a monolithic IC in which an active element such as a MOS transistor and a passive element such as an inductor are formed on a single semiconductor substrate.

Figure 1:
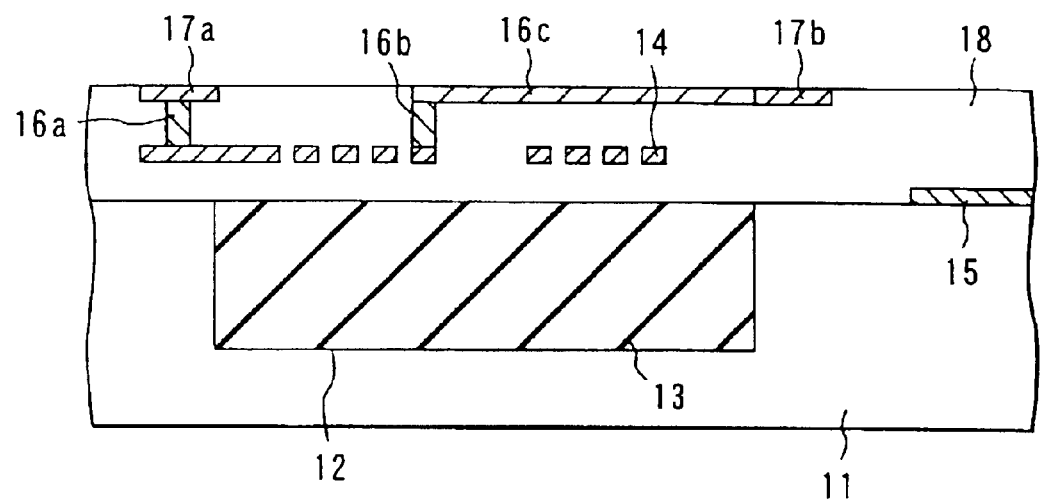
FIG. 1 is a cross sectional view exemplifying the construction of the gist portion of an integrated circuit device according to a first embodiment of the present invention.
Figure 2:
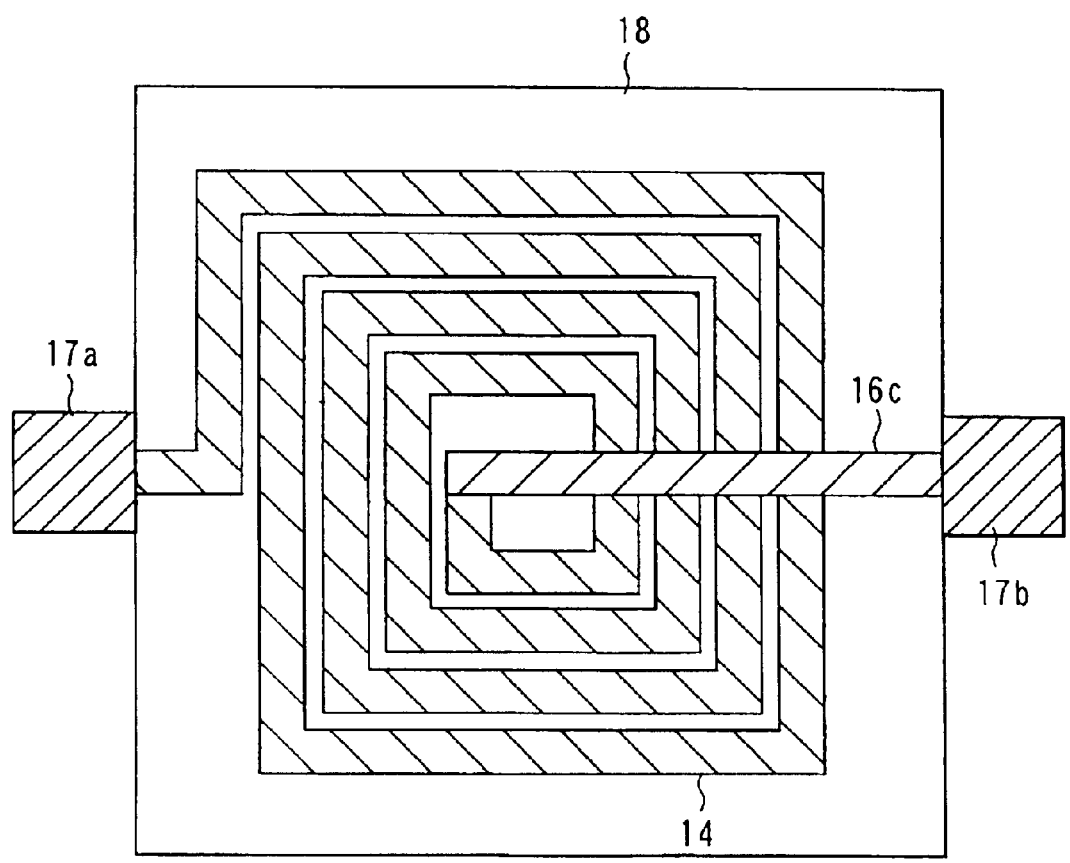
FIG. 2 is a plan view exemplifying the construction of the gist portion of an integrated circuit device according to a first embodiment of the present invention.

FIG. 1 is a cross sectional view showing the construction of a monolithic IC according to the first embodiment of the present invention. FIG. 2 is a plan view showing the construction of mainly a spiral inductor included in the monolithic IC shown in FIG. 1.

As shown in FIG. 1, an insulating film 13 having a low dielectric constant is buried in a groove 12 formed on a semiconductor substrate 11, and a spiral inductor 14 is formed above the insulating film 13. Since a strong electromagnetic wave is generated right under the spiral inductor 14, an active element section 15 consisting of an active element such as a MOS transistor and a first wiring layer is arranged apart from the region in which the insulating film 13 having a low dielectric constant is buried.

It is desirable for the groove 12 to have a depth, i.e., the thickness of the insulating film 13 within the groove 12, of at least 20 μm. In this embodiment, the groove 12 has a depth of 50 μm. The material of the insulating film 13 having a low dielectric constant is not particularly limited. In this embodiment, an organic insulating film having a relative dielectric constant of about 2.6 is used for forming the insulating film 13.

The spiral inductor 14 is formed by using a wiring material used as a second wiring layer. In this embodiment, copper having a low resistivity is used as the wiring material. The spiral inductor 14 has a wiring width of 8 μm, a space width of 2 μm and thickness of 1 μm and is formed in a region of 500 μm square.

One end of the spiral inductor 14 is connected to a pad 17a via a connecting section 16a, with the other end being connected to a pad 17b via connecting sections 16b and 16c.

Incidentally, the periphery of each of the constituents described above is covered with an interlayer insulating film 18 consisting of a plurality of layers.

The manufacturing process of the monolithic IC shown in FIGS. 1 and 2 will now be described with reference to FIGS. 3A to 3D.

Figure 3A:
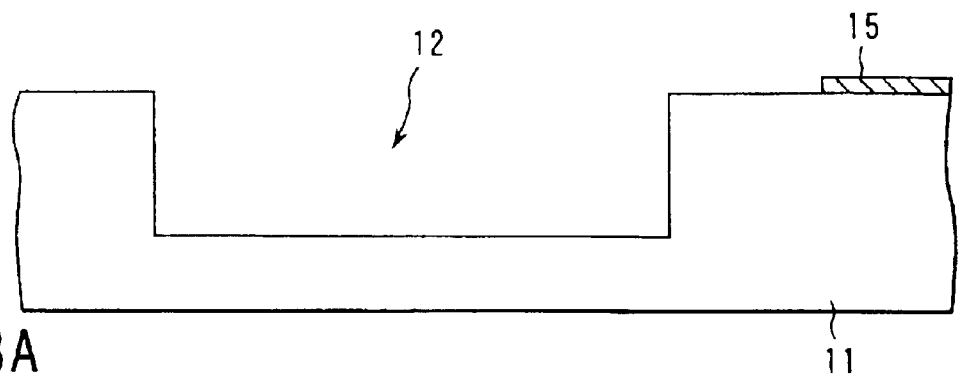
FIGS. 3A to 3D are cross sectional views collectively showing the steps for obtaining the structure shown in FIG. 1.

In the first step, an active element section 15 consisting of an active element such as a MOS transistor and a first wiring layer connected to the gate and source-drain of the MOS transistor is formed on the silicon substrate 11 by the ordinary manufacturing process of a semiconductor device, as shown in FIG. 3A. Then, an anisotropic etching using a reactive ion etching (RIE) is applied to the silicon substrate 11 to form the groove 12. In this embodiment, the groove 12 is sized 510 μm square and has a depth of 50 μm. By forming the active element section 15 in advance before formation of the groove 12, it is possible to use an organic insulating film as an insulating material buried in the groove 12. In general, the organic insulating film has a heat-resistant temperature of about 450° C. and, thus, is incapable of withstanding the forming temperature (about 1,000° C.) of the active element.

Figure 4:
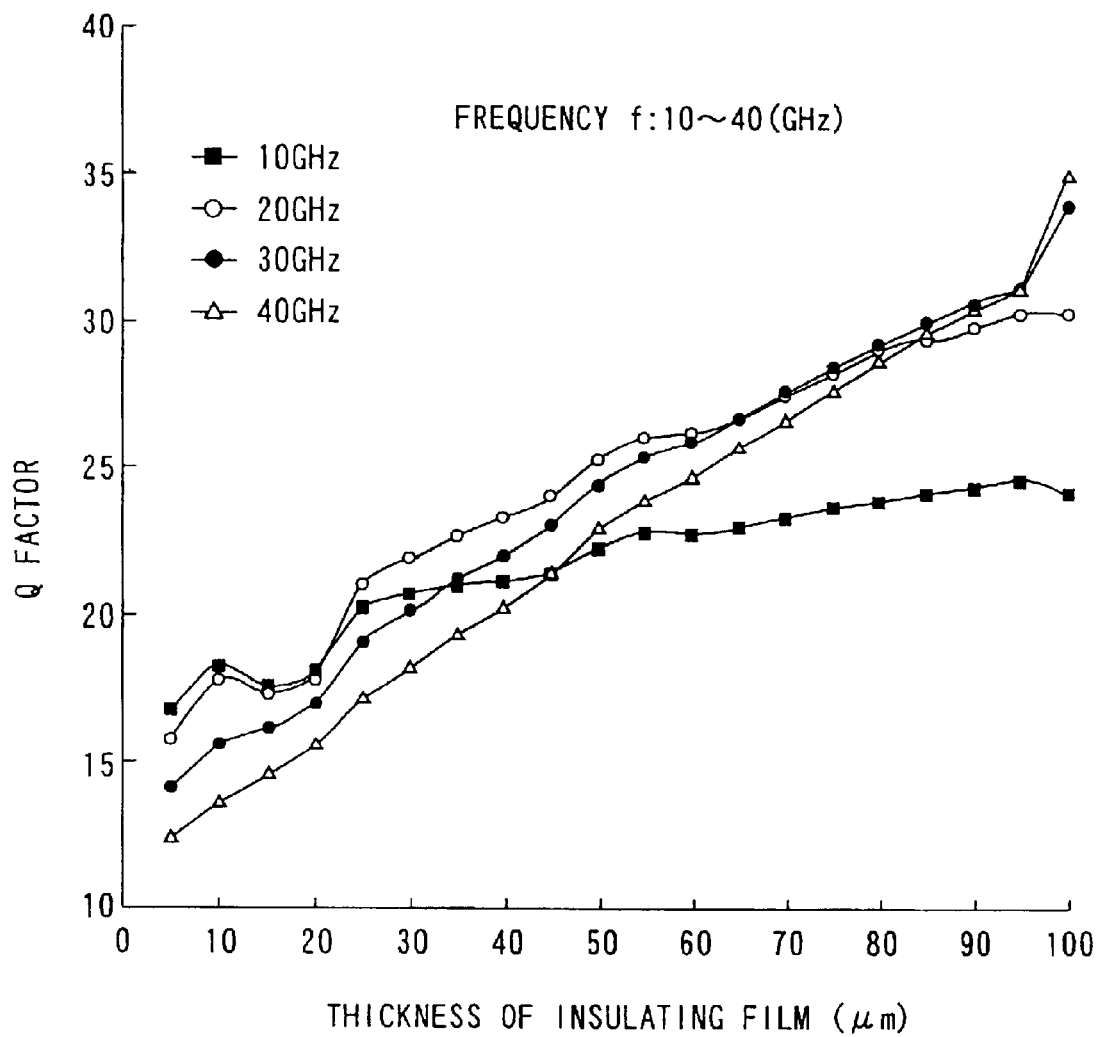
FIG. 4 is a graph showing the relationship between the thickness of the insulating film buried in a groove and the Q factor covering the case where the frequency imparted to the inductor is changed.

FIG. 4 shows the result of simulation on the relationship between the thickness of the insulating film having a low dielectric constant, which is buried in the groove, and the Q factor, covering the case where the frequency f imparted to the inductor is changed within a high frequency band exceeding 10 GHz. In the simulation, the resistivity of the silicon substrate was set at 1.0 Ω·cm, and the inductor was formed of Cu, had a thickness of 1 μm, a width of 20 μm and an entire length of 2 μm. The Q factor is increased with increase in the thickness of the insulating film having a low dielectric constant, i.e., with increase in the depth of the groove. However, the Q factor cannot be increased reasonably if the thickness of the insulating film having a low dielectric constant is not larger than 20 μm. Clearly, it is desirable for the thickness of the insulating film having a low dielectric constant, i.e., the depth of the groove 12, to be at least 20 μm.

Since it is necessary to form the groove 12 deep, it is desirable for the etching rate of the anisotropic etching to be higher than the ordinary etching rate. For example, a high etching rate not lower than, for example, 10 μm/min, is required. For achieving such a high etching rate, the anisotropic etching is performed by using a high density plasma generating apparatus, with a fluorine-containing gas such as an SF-based gas or a CF-based gas used as an etching gas.

Figure 3B:
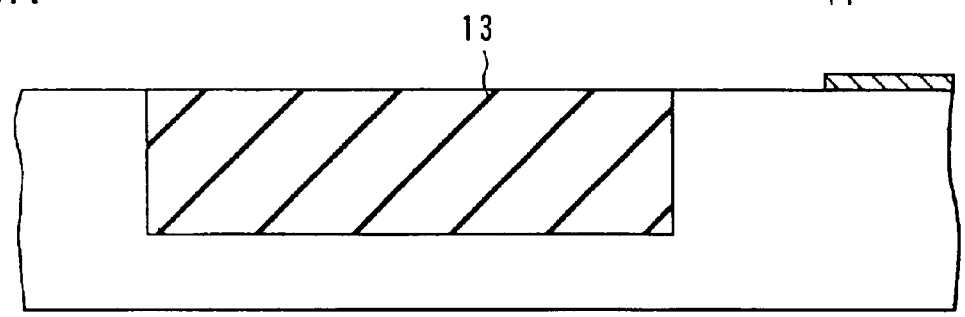

In the next step, the insulating film 13 having a low dielectric constant is formed by burying an insulating material having a low dielectric constant in the groove 12, as shown in FIG. 3B. Since the groove 12 is deep, i.e., 50 μm deep, it is desirable to use a coated film for forming the insulating film 13 having a low dielectric constant. In this embodiment, an organic coated film is used. For forming the coated film, it is possible to employ, for example, a spin coating method in which the entire wafer is centrifugally coated with an insulating liquid (insulating fluid) by rotating the wafer, a spray coating method in which the wafer is coated with a mist of an insulating fluid, and a printing method using a stencil mask and a squeegee.

In the case of employing the spin coating method, the viscosity of the liquid is set high, i.e., about 1,000 to 10,000 cps, and the rotating speed of the wafer is set at a relatively low level, i.e., about 1,000 to 10,000 rpm, because it is necessary to form a thick film.

In the case of employing the spray coating method, the viscosity of the liquid is set at a low level, i.e., not higher than 1,000 cps, so as to convert the liquid into a mist having a directivity. In the spray coating method, it is possible to scan the spray nozzle relative to the wafer. It is also possible to use a spray nozzle head covering the entire surface of the wafer. Also, since the region outside the groove need not be coated with the liquid in a thickness equal to that in the groove portion, it is possible to apply the spraying with the region outside the groove covered with a mask. Further, by the same reason, it is possible to scan the spray nozzle so as to apply spraying selectively to the groove portion.

In the case of employing the printing method, it is desirable to set the viscosity of the liquid at a high level, i.e., no lower than 10,000 cP. In the printing method using a mask and a squeegee, the required portion alone is selectively coated with the liquid.

The insulating film 13 having a low dielectric constant is formed by coating the silicon substrate 11 with an insulating fluid by any of the methods described above, followed by solidifying the coated insulating fluid. A method using an electron beam or light can be employed as well as a method utilizing heat for solidifying the insulating fluid.

It is desirable to use an insulating fluid that is small in the change of volume when converted into a solid, e.g., an insulating fluid containing a small amount of a solvent. It is also desirable to use an insulating fluid having a high fluidity such that the fluid is fluidized when the fluid is left stationary so as to be planarized. In this sense, the insulating fluid used in the present invention should desirably exhibit a good wettability with the substrate. Also, since it is necessary for the insulating fluid to fill a large groove and it is necessary to suppress the volume shrinkage, it is possible to add a granular insulating material to the insulating fluid. Further, it is possible to form a film-like insulating material on a substrate having a low adhesivity such as PTF, followed by transferring the insulating material onto a substrate having a groove formed therein by thermal compression.

After formation of the insulating film 13 having a low dielectric constant on the silicon substrate 11 by the method described above, the excess insulating film positioned outside the groove 12 is removed. The excess insulating film can be removed by, for example, a CMP method. It is also possible to blow a solvent against the substrate, which is rotated at a high speed, before the coated film is polymerized so as to etch back the surface region of the coated film.

Figure 3C:
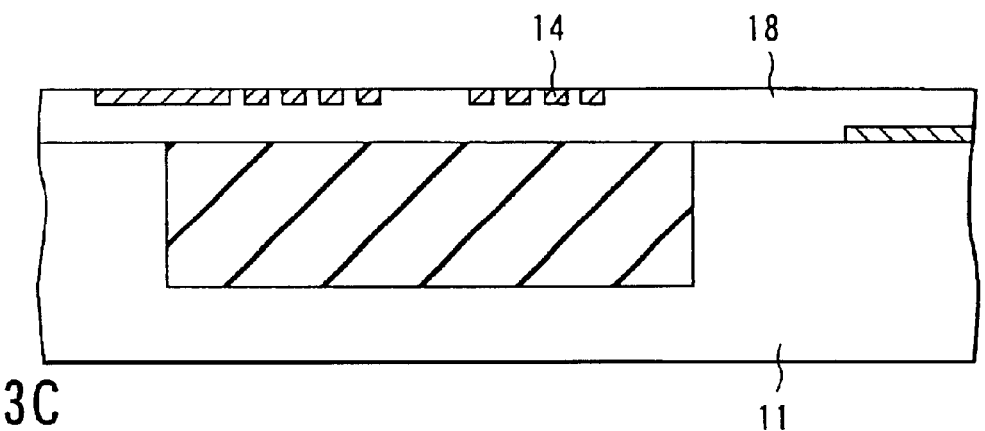

In the next step, an interlayer insulating film 18 on a lower side is formed, followed by forming the spiral inductor 14 having a damascene structure, as shown in FIG. 3C. To be more specific, a groove is formed in the interlayer insulating film 18, followed by burying Cu in the groove and subsequently removing the excess Cu positioned outside the groove by a CMP method. It is desirable for the spiral inductor 14 to be formed by using a wiring material used as a second wiring layer in the step of forming the second wiring layer. It is also possible to form the spiral inductor 14 by depositing a metal such as Al on the entire surface, followed by patterning the metal such as Al by RIE.

Figure 3D:
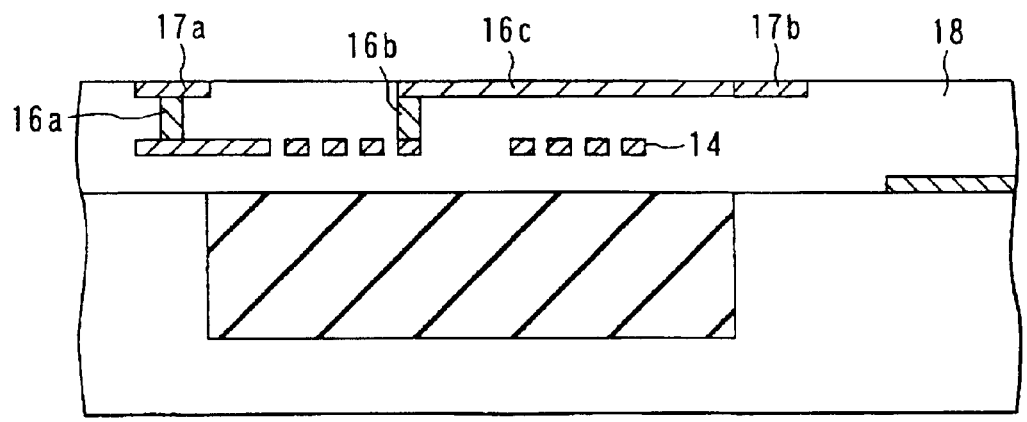

Finally, an interlayer insulating film 18 on an upper side is formed, followed by forming the connecting sections 16a, 16b, 16c and the pads 17a, 17b, as shown in FIG. 3D. In this fashion, the monolithic IC constructed as shown in FIGS. 1 and 2 is manufactured.

Incidentally, in this embodiment, the groove was formed and the insulating film was buried in the groove after formation of the active element because the organic insulating film used had a low temperature resistance. In the case where it is possible to form an insulating film having a high heat resistance, the groove can be formed and the insulating film can be buried in the groove before formation of the active element. Also, in this embodiment, the wiring material of the second wiring layer was used for forming the spiral inductor. However, it is also possible to use a wiring material of a third or higher wiring layer for forming the spiral inductor.

As described above, in the first embodiment, a groove having a depth of at least 20 $\mu$m is formed in the semiconductor substrate, and the spiral inductor is formed above the insulating film buried in the groove, making it possible to sufficiently lower the parasitic capacitance and the parasitic resistance relative to the spiral inductor. Also, since the inductor is not of an air-floating wiring structure as in the prior art, it is possible to ensure a sufficient mechanical strength.

(Embodiment 2)

A second embodiment of the present invention will now be described. The second embodiment is directed to a monolithic IC prepared by forming an active element such as a MOS transistor on a first substrate and a passive element such as an inductor on a second substrate, followed by bonding the first and second substrates.

Figure 5:
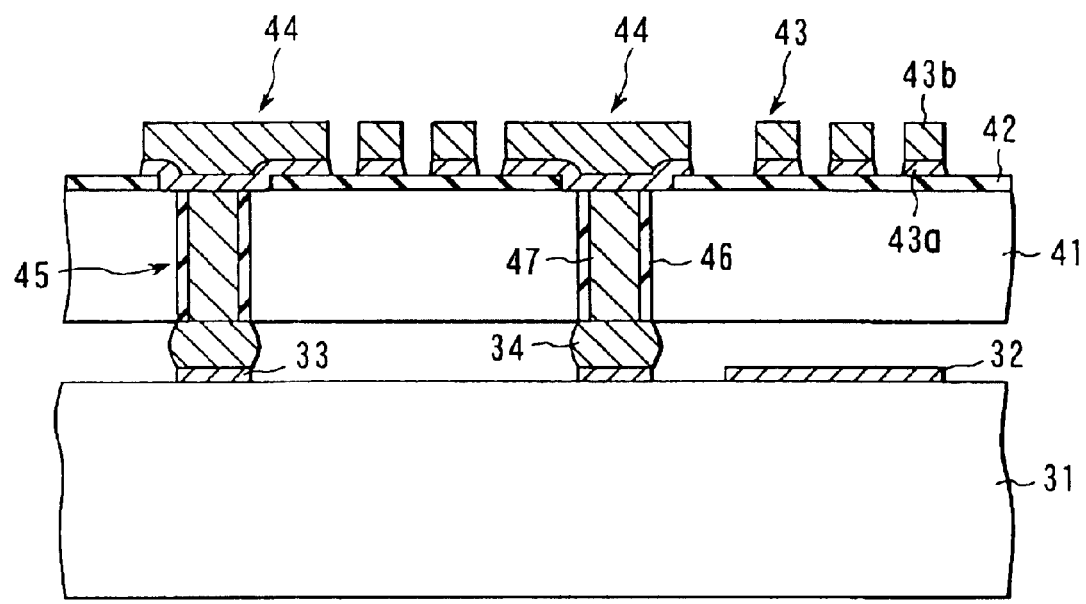
FIG. 5 is a cross sectional view exemplifying the construction of the gist portion of an integrated circuit device according to a second embodiment of the present invention.
Figure 6:
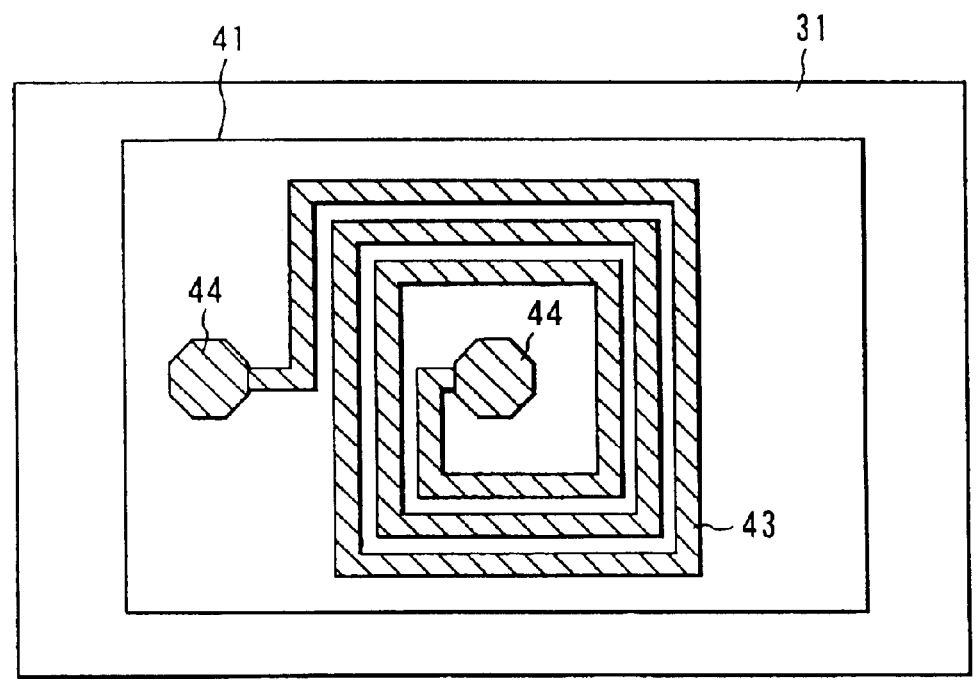
FIG. 6 is a plan view exemplifying the construction of the gist portion of an integrated circuit device according to a second embodiment of the present invention.

FIG. 5 is a cross sectional view showing the construction of the monolithic IC according to the second embodiment of the present invention. FIG. 6 is a plan view showing the construction of mainly a spiral inductor included in the monolithic IC shown in FIG. 5.

As shown in FIG. 5, an n-type or p-type silicon substrate is used as a substrate 31 for an active element. An active element section 32 consisting of an active element such as a MOS transistor and a wiring is formed on the silicon substrate 31. Also, pads 33 connected to the active element such as a MOS transistor are formed on the silicon substrate 31 and bumps 34 made of a solder are formed on the pads 33.

An intrinsic silicon substrate that scarcely contains impurities and exhibits a high resistivity is used as a substrate 41 for a passive element. A spiral inductor 43 is formed on the silicon substrate 41 having a high resistivity with an insulating film 42 interposed therebetween. An electrode 47, which is formed within a through-hole 45 with an insulating film 46 interposed therebetween, is positioned right under a pad 44 of the spiral inductor 43. The pad 44 is shaped octagonal in this embodiment. The pad 44 of the spiral inductor is connected to the bump 34 via the electrode 47. In other words, the spiral inductor 43 is electrically connected to the active element formed on the substrate 31 for an active element via the electrode 47.

The spiral inductor 43 is formed by an electroplating method. In this embodiment, the spiral inductor 43 is constructed such that a Cu film 43b is formed on a seed layer 43a made of Cu. Also, the spiral inductor 43 is sized at 8 $\mu$m in wiring width, 2 $\mu$m in space and 5 $\mu$m in thickness and is formed in a region of 500 $\mu$m square.

How to manufacture the monolithic IC shown in FIGS. 5 and 6 will now be described.

First of all, the process for forming the spiral inductor, etc., on the substrate 41 for a passive element will be described with reference to FIGS. 7A to 7F.

Figure 7A:
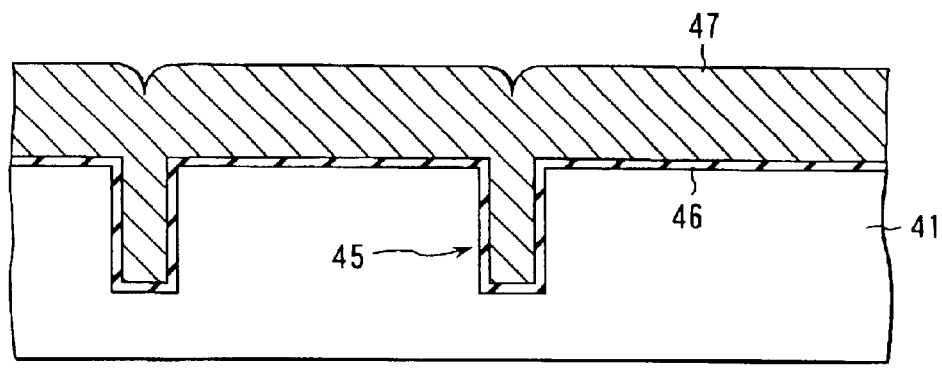
FIGS. 7A to 7F are cross sectional views collectively exemplifying the process of forming an inductor, etc. on the substrate for a passive element, which is shown in FIG. 5.

In the first step, a connection hole 45 having a depth of 50 to 100 $\mu$m and a diameter of 30 to 50 $\mu$m is formed on the silicon substrate 41 having a high resistivity, as shown in FIG. 7A. Then, an insulating film 46 is formed on the entire surface, followed by forming a metal film 47 on the insulating film 46.

Figure 7B:
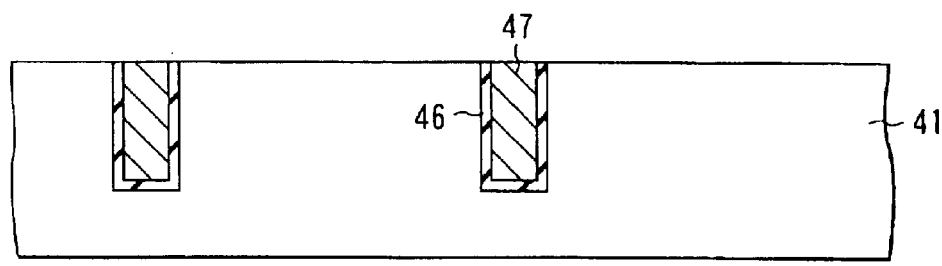

In the next step, those portions of the metal film 47 and the insulating film 46 which are positioned outside the connection hole 45 are removed by a CMP method so as to allow the metal film 47 and the insulating film 46 to remain only within the connection hole 46, as shown in FIG. 7B. The metal film 47 remaining within the connection hole 45 forms an electrode extending through the silicon substrate 41.

Figure 7C:
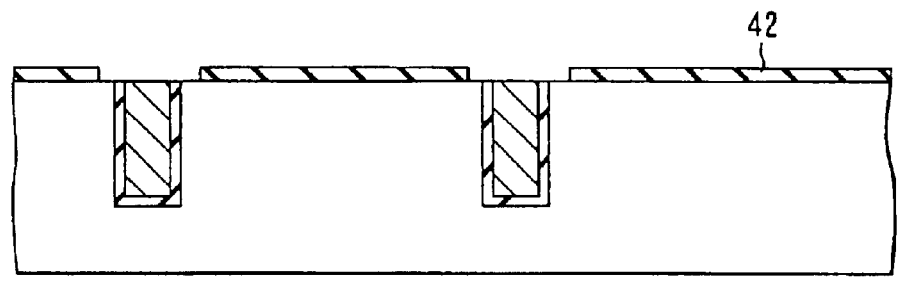

Then, an insulating film 42 is formed on the entire surface, as shown in FIG. 7C, followed by removing that portion of the insulating film 42 which is positioned on and around the electrode 47 so as to expose the upper surface of the electrode 47. Further, a metal film forming a spiral inductor is formed by an electroplating as follows.

Figure 7D:
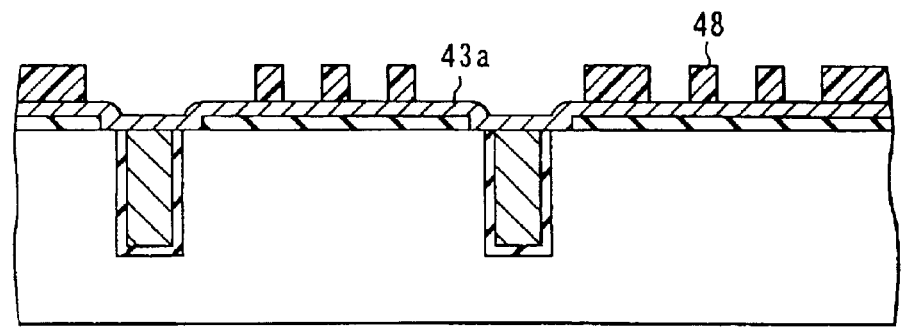

Specifically, a copper layer is formed in a thickness of about 0.1 $\mu$m as a seed layer 43a forming an electrode by an electroless plating method, as shown in FIG. 7D. It is possible to form a barrier layer in order to improve the adhesivity with the surface of the substrate. It is possible to use Cr, Ni, Pt, etc. for forming the barrier layer. Then, a resist pattern 48 is formed on the seed layer 43a.

Figure 7E:
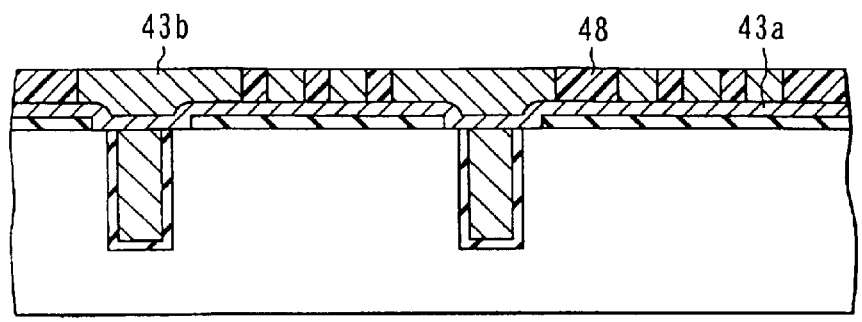

In the next step, the substrate is dipped in a plating solution and a copper film 43b is formed by applying an electric field between the seed layer 43a and the plating solution, as shown in FIG. 7E. The copper film 43b is not formed in the region where the resist layer 48 is formed, with the result that the copper film 43b is selectively formed on the exposed regions of the seed layer 43a between adjacent resist layers 48.

Figure 7F:
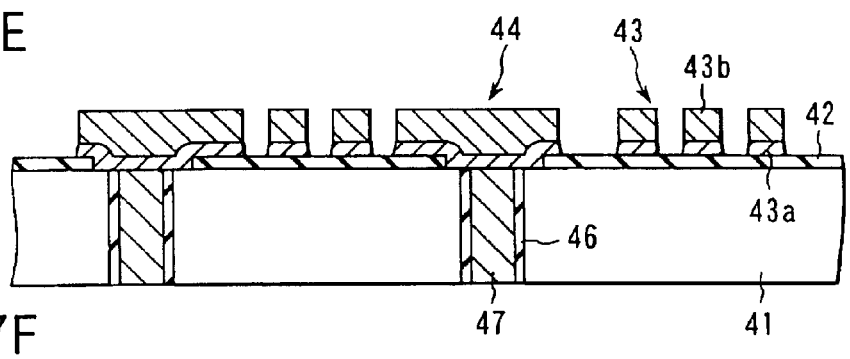

In the next step, the resist layer 48 is peeled with a peeling solution, followed by subjecting the seed layer 43a to a wet etching, as shown in FIG. 7F. In this step, the copper film 43b may also be etched to some extent. In such a case, it suffices to make the copper film 43b somewhat larger in width and thickness. The spiral inductor 43 consisting of the seed layer 43a and the copper film 43b is formed in this fashion. Finally, the silicon substrate 41 is polished from the back surface so as to expose the back surface of the electrode 47 to the outside, with the result that the electrode 47 extends through the silicon substrate 41.

Then, a passivation film, etc. is formed as required on the side on which the spiral inductor 43 is formed.

Figure 8:
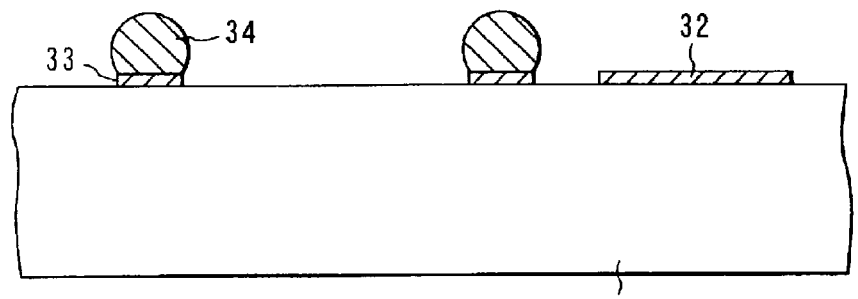
FIG. 8 is a cross sectional view exemplifying the construction prepared by forming an active element on the substrate for an active element shown in FIG. 5.

On the other hand, an active element section 32 consisting of an active element such as a MOS transistor and a wiring and a pad 33 connected to the MOS transistor, etc. are formed by the ordinary semiconductor manufacturing process on the substrate 31 for an active element, as shown in FIG. 8. Further, a bump 34 consisting of a solder is formed on the pad 33.

Finally, the substrate 31 for an active element thus prepared is aligned with the substrate 41 for a passive element to face each other, and the bump 34 formed on the substrate 31 for an active element is bonded under pressure to the electrode 47 formed on the substrate 41 for a passive element, thereby finish manufacturing the monolithic IC shown in FIGS. 5 and 6.

In the embodiment described above, the bump is formed on the substrate for an active element. However, it is possible to form the bump on the substrate for a passive element or on each of the substrates for active and passive elements.

It is also possible to laminate the substrate for a passive element on the substrate for a passive element and to connect these two substrates by an electrode and a bump connected to the electrode by the method substantially equal to the method described above. In this case, it is possible to laminate a plurality of substrates for a passive element on the substrate for an active element.

In this embodiment, the distance between the spiral inductor 43 and the silicon substrate 31 for an active element is larger than the sum of the height of the bump 34 and the thickness of the substrate 41 for a passive element. It follows that it is possible to lower the influence such as the parasitic resistance (eddy current loss) and the parasitic capacitance given by the silicon substrate 31 for an active element to the spiral inductor 43.

It should also be noted that, in a device operating in a high frequency region, it is desirable to diminish as much as possible the capacitance between the bump or pad and the substrate for an active element. Therefore, it is desirable for the bump or pad to be sized at 50 $\mu$m or less. However, as already described in conjunction with the prior art, where the substrate for an active element and the substrate for a passive element are arranged to permit the element forming regions of these substrates to face each other, it was necessary to enlarge the bump to some extent so as to make these two substrates sufficiently apart from each other in order to weaken the influence given by the substrate for an active element to the inductor. Such being the situation, it was impossible in the prior art to unduly diminish the bump or the pad. In this embodiment, however, the distance between the inductor and the substrate for an active element is larger than the sum of the height of the bump and the thickness of the substrate for a passive element. It follows that it is possible to ensure a sufficient distance between the inductor and the substrate for an active element even if the bump and the pad are diminished.

It should be noted that the silicon substrate 41 having a high resistivity is used in this embodiment as the substrate for a passive element. Therefore, the influence given by the silicon substrate 41 having a high resistivity to the spiral inductor 43 is very small and negligible.

Figure 9:
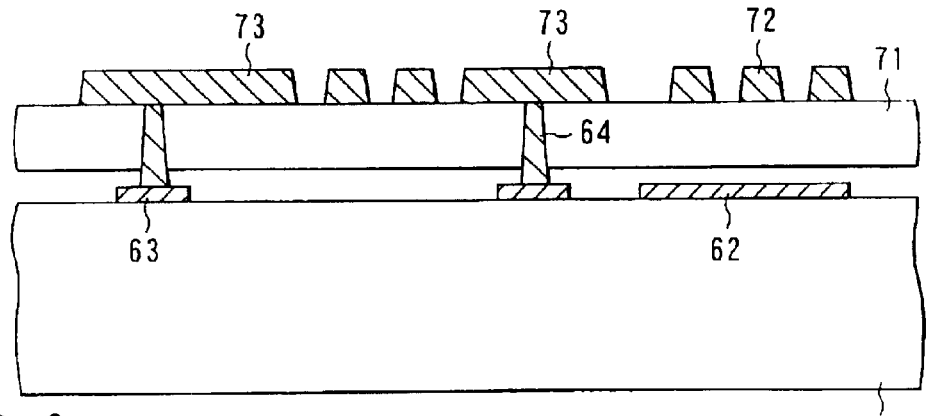
FIG. 9 is a cross sectional view exemplifying the construction of the gist portion of an integrated circuit device according to a modification of the second embodiment of the present invention.

FIG. 9 is a cross sectional view showing the construction of a monolithic IC according to a modification of the second embodiment. As shown in the drawing, an n-type or p-type silicon substrate is used as a substrate 61 for an active element. An active element section 62 consisting of an active element such as a MOS transistor and a wiring is formed on the silicon substrate 61. A pad 63 connected to the active element such as a MOS transistor is formed on the silicon substrate 61, and a projection-like electrode 64 is formed on the pad 63.

An insulating substrate made of an organic material such as polyimide is used as a substrate 71 for a passive element. A spiral inductor 72 is formed on the insulating substrate 71. A pad 73 of the spiral inductor 72 is connected to a pad 63 formed on the substrate for an active element by the projection-like electrode 64. In other words, the spiral inductor 72 is electrically connected to the active element formed on the substrate 61 for an active element by the projection-like electrode 64. The spiral inductor 72 is formed by patterning a copper foil. The basic planar shapes of the spiral inductor 72, etc. are substantially equal to the planar shapes shown in FIG. 6.

A process of manufacturing the monolithic IC shown in FIG. 9 will now be described.

First of all, the process for forming a spiral inductor, etc. on the substrate 71 for a passive element will now be described with reference to FIGS. 10A to 10C.

Figure 10A:
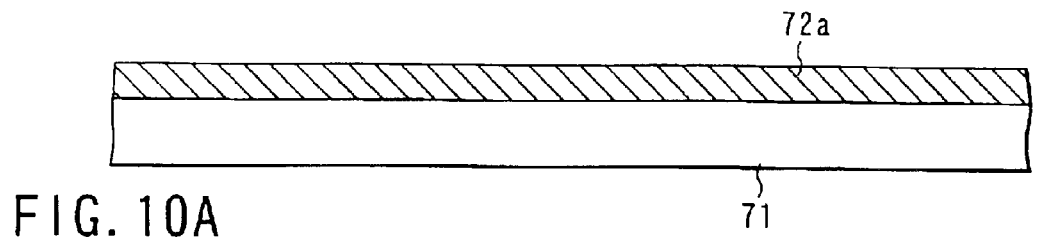
FIGS. 10A to 10C are cross sectional views collectively exemplifying the process of forming an inductor, etc. on the substrate for a passive element shown in FIG. 9.

In the first step, a polyimide film having a thickness of 30 $\mu$m and forming the insulating substrate 71 is attached to a copper foil 72a having a thickness of 18 $\mu$m, as shown in FIG. 10A. The structure shown in FIG. 10A can be obtained by directly plating the polyimide with the copper foil 72a, followed by curing the polyimide layer at 300° C.

Figure 10B:
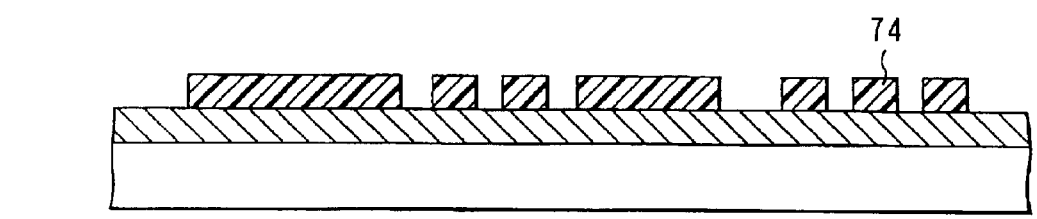
Figure 10C:
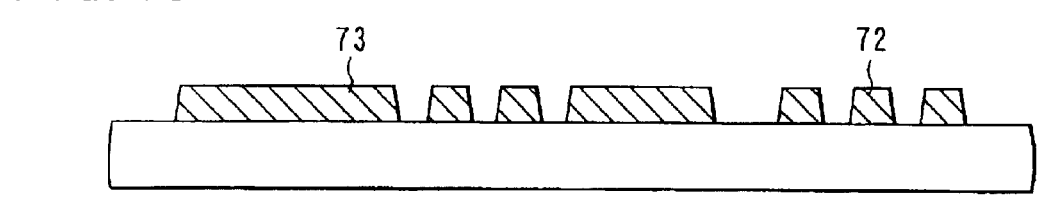

In the next step, a pattern of a resist layer 74 is formed on the copper foil 72a, as shown in FIG. 10B. Then, the copper foil 72a is etched with an etchant containing sulfuric acid by using the resist layer 74 as a mask so as to form a spiral inductor 72 and a pad 73 for the spiral inductor, as shown in FIG. 10C. By employing the wet etching, the copper foil 72a having a large thickness can be etched easily so as to make it possible to simplify the process and to lower the manufacturing cost.

Then, a passivation film, etc. are formed, as required, on the side on which the spiral inductor 72 is formed.

Figure 11:
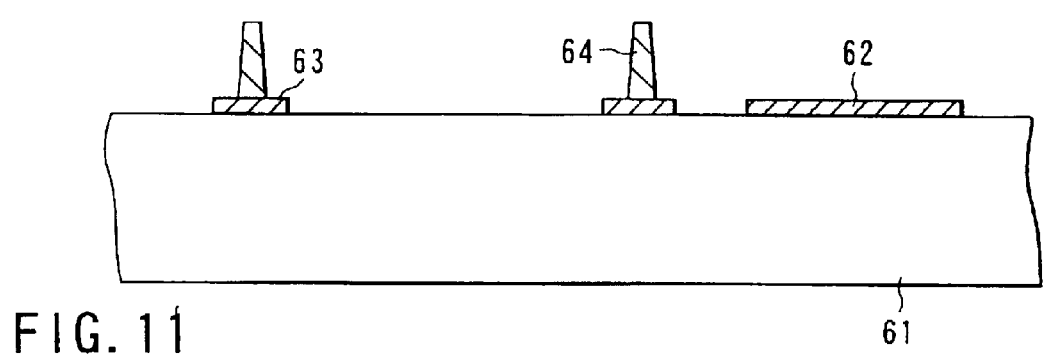
FIG. 11 is a cross sectional view exemplifying the construction prepared by forming an active element, etc. on the substrate for a passive element shown in FIG. 9.

On the other hand, an active element section 62 consisting of an active element such as a MOS transistor and a wiring, etc. and a pad 63 connected to the MOS transistor, etc. are formed on a silicon substrate 61 for an active element, as shown in FIG. 11. Further, a projection-like electrode 64 is formed on the pad 63. The projection-like electrode 64 is obtained by forming a metallic material pattern by a plating method or a printing method.

The substrate 61 for an active element and the substrate 71 for a passive element thus prepared are aligned to face each other. Further, the projection-like electrode 64 formed on the substrate 61 for an active element is pushed into the substrate 71 for a passive element, followed by bonding under pressure the projection-like electrode 64 to the pad 73 formed in the substrate 71 for a passive element. Since the substrate 71 for a passive element is formed of a polyimide film, the projection-like electrode 64 extends through the polyimide film so as to be connected under pressure to the pad 73. As a result, manufacture of the monolithic IC as shown in FIG. 9 is completed.

Figure 12:
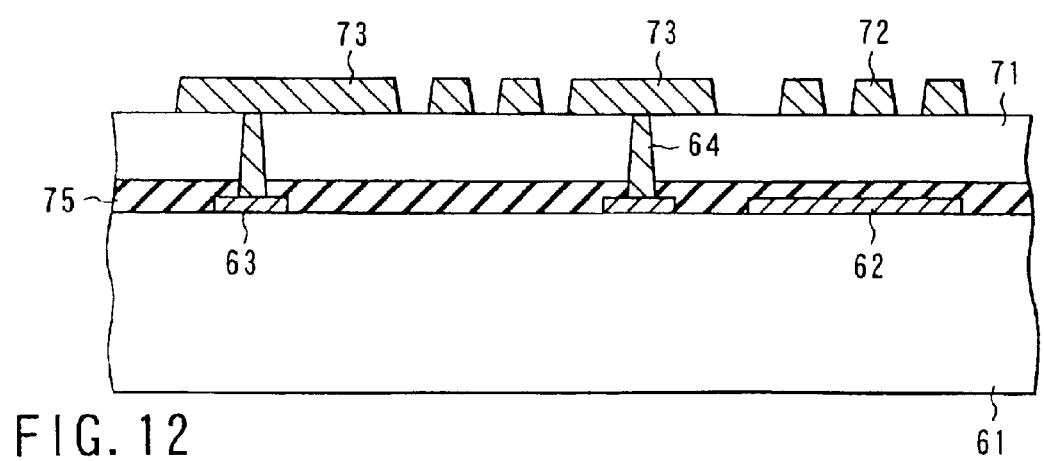
FIG. 12 is a cross sectional view showing a modification of the integrated circuit device shown in FIG. 9.

Since the substrate for a passive element is formed of a polyimide film in this modification, it is necessary to moderate the strain caused by, for example, the thermal stress between the substrate for an active element and the polyimide film. Therefore, the thermal expansion coefficient of the substrate material and the distance between adjacent electrodes extending through the substrate for a passive element are made optimum. Also, in order to prevent warping, etc. of the polyimide film caused by the strain, it is desirable to load an insulating material 75 having a low modulus of elasticity and a low dielectric constant (desirably, a relative dielectric constant of 4.0 or less) such as a silicone resin or an epoxy resin in the clearance between the substrate for an active element and the polyimide film, as shown in FIG. 12. Also, it is desirable to use an insulating material low in water permeability and water absorption properties in order to lower the effect given by the temperature, humidity, etc.

As in the embodiment described previously, the distance between the spiral inductor and the substrate for an active element can be diminished in this modification, too, so as to diminish the influence given by the substrate for an active element to the spiral inductor.

(Embodiment 3)

A third embodiment of the present invention will now be described. The third embodiment relates to a circuit board, particularly, a circuit board suitable for a thin film package substrate such as multi-chip module, a CSP package, a tape-like film carrier, a film-like passage element such as a resistor (R), an inductor (L), a capacitor (C) or a module consisting of R, L and C, or a multi-layer substrate wiring such as an interposer.

FIGS. 13A to 13F are cross sectional views collectively showing a method of manufacturing a circuit board according to the third embodiment of the present invention.

Figure 13A:
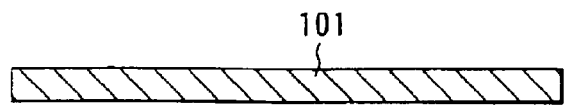
FIGS. 13A to 13F are cross sectional views collectively showing a process of manufacturing a circuit board according to a third embodiment of the present invention.
Figure 13B:
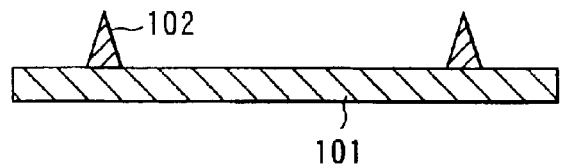

In the first step, a copper foil 101 is prepared as shown in FIG. 13A, followed by forming a plug 102 on the copper foil 101 by using a conductive paste having magnetic properties, as shown in FIG. 13B.

Figure 14A:
FIGS. 14A to 14C are cross sectional views collectively showing a process of manufacturing a circuit board according to a modification of the third embodiment of the present invention.
Figure 14B:
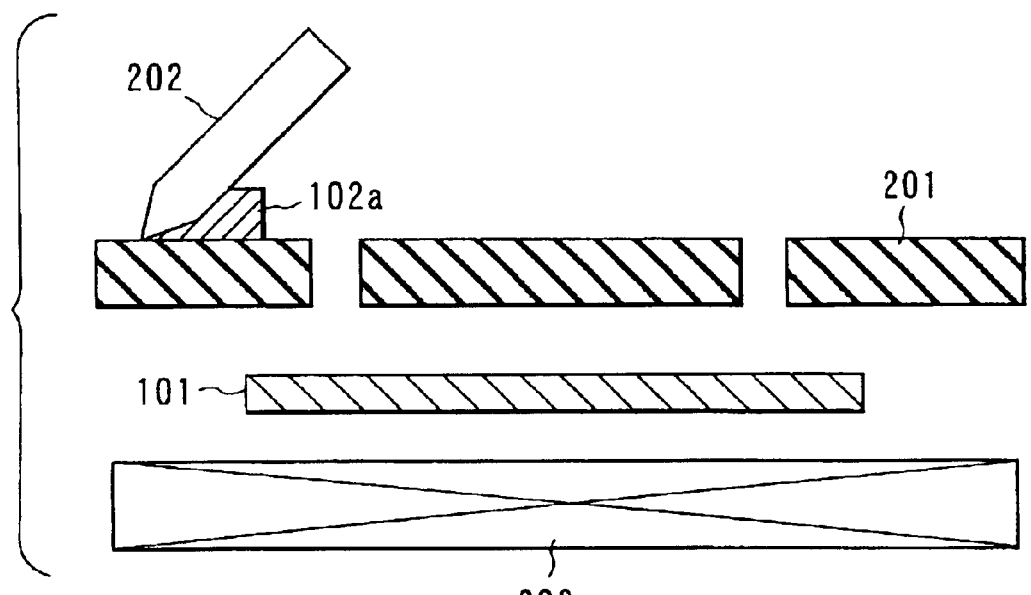
Figure 14C:
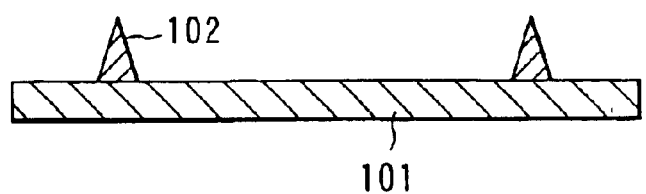

FIGS. 14A to 14C schematically shows a method of forming the plug 102.

As shown in the drawings, a conductive paste 102a having magnetic properties is printed on the copper foil 101 with a squeegee 202 by using a printing plate 201 having openings corresponding to the plug 102. Since a magnet 203 is arranged on the back side of the copper foil 101, the conductive paste 102a can be printed accurately in a desired shape by controlling the magnetic properties. For example, it is possible to print the conductive paste 102a having a sharpened tip portion. The plug 102 is formed by solidifying the printed conductive paste 102a by heating.

For preparing the conductive paste 102a having magnetic properties, a mixture consisting of magnetic particles such as particles of Ni, Fe, Co or FeO, a nonmagnetic conductive particles such as particles of Ag, Cu or Au and a binder such as an epoxy resin or an acrylic resin is dispersed in a solvent, and the viscosity and thixotropy of the solution is controlled by the solvent.

Figure 13C:
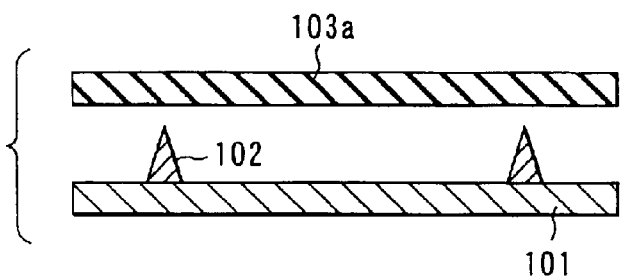

After formation of the plug 102, an insulating sheet 103a consisting of a compound containing polyimide as a main component is prepared and the insulating sheet 103a thus prepared is subjected to contact bonding to the copper foil 101 having the plug 102 formed thereon, as shown in FIG. 13C. By this contact bonding treatment, the plug 102 is allowed to extend through the insulating sheet 103a, followed by applying a curing treatment. The compound containing polyimide, which is used in the present invention, should have a low modulus of elasticity, i.e., modulus of elasticity lower than 10 GPa. In other examples, similar compounds containing polyimide are used. By using the particular material, an insulating layer exhibiting an excellent adhesivity can be formed easily without using an adhesive layer so as to simplify the manufacturing process.

The polyimide-containing compound consists mainly of two components, i.e., a polyimide component containing a polyamic acid and a polymer component other than the polyimide component.

In general, polyimide is obtained by forming a polyamic acid by polycondensation between an acid dianhydride and a diamine, followed by heating the resultant polyamic acid to 250 to 350° C. for forming an imide by the dehydrating-ring closure reaction. However, the polyamic acid, which is a precursor of the polyimide, is generally unstable and poor in storage stability. It is difficult to improve these defects by adding another component. Therefore, it was difficult to improve the mechanical properties such as an adhesivity and the elasticity.

On the other hand, the polyimide-containing compound used in this embodiment is obtained by mixing polyimide particles containing a relatively stable polyamic acid with a polymer having reaction radicals, e.g., polymer such as rubber and silicone having a low modulus of elasticity, and heating the mixture to 200 to 250° C. so as to carry out reactions between the polyimide particles and the polymer.

Figure 13D:
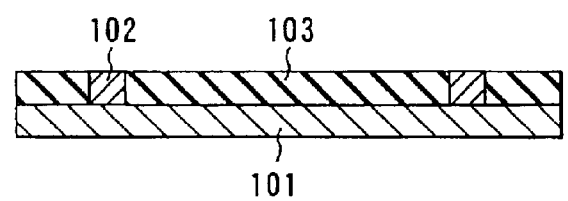

Then, where the tip portion of the plug 102 projects through the upper surface of the insulating sheet 103a, a planarizing treatment is performed by, for example, CMP. As a result, it is possible to obtain a structure in which the plug 102 is formed within the insulating layer 103, as shown in FIG. 13D.

Figure 13E:
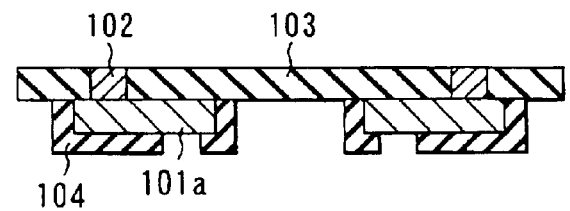

In the next step, a resist pattern (not shown) is formed on the copper foil 101. The copper foil 101 is etched with the resist pattern used as a mask so as to form a circuit pattern 101a consisting of, for example, a wiring. After removal of the resist pattern, a pattern of a solder resist 104 is formed on the circuit pattern 101a so as to obtain a circuit board as shown in FIG. 13E.

Figure 13F:
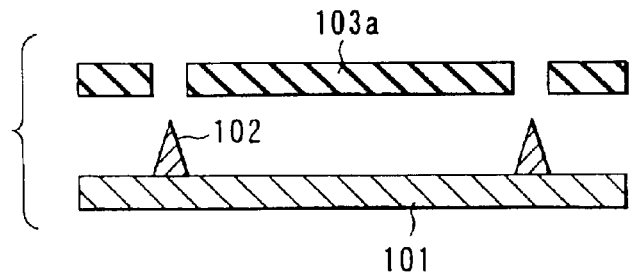

In the embodiment described above, the insulating sheet 103a in which a pattern is not formed was used in the process shown in FIG. 13C. However, it is possible to use the insulating sheet 103a having an-opening pattern in the position corresponding to the plug 102 as shown in FIG. 13F.

FIGS. 15A to 15E are cross sectional views collectively showing a method of manufacturing a circuit board according to a modification of the third embodiment. The constituents shown in these drawings, which correspond to those shown in FIGS. 13A to 13F, are denoted by the same reference numerals so as to omit detailed description thereof.

Figure 15A:
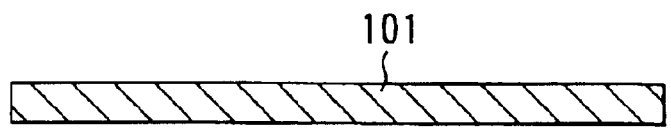
FIGS. 15A to 15E are cross sectional views collectively showing a process of manufacturing a circuit board according to another modification of the third embodiment of the present invention.
Figure 15B:
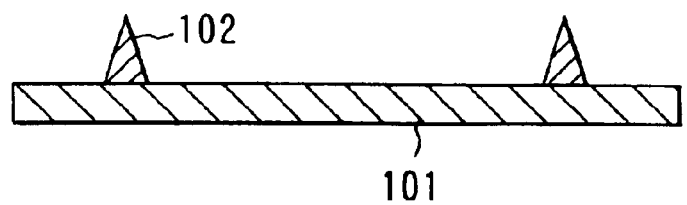
Figure 15C:
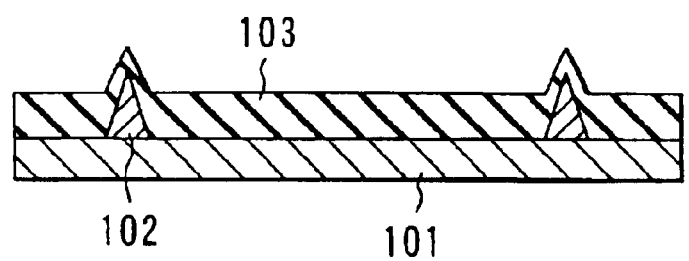
Figure 15D:
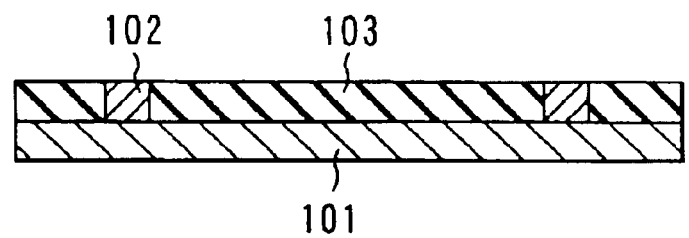
Figure 15E:
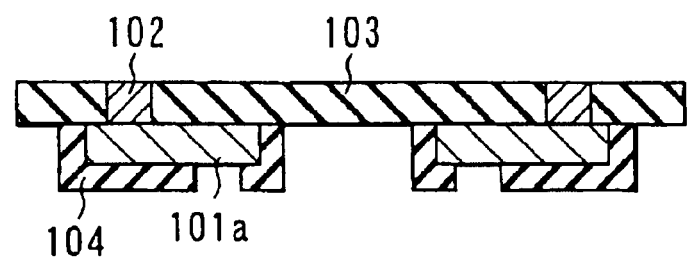

The basic process shown in FIGS. 15A to 15E is substantially equal to that shown in FIGS. 13A to 13F, except that, in the modification shown in FIGS. 15A to 15F, the insulating layer 103 made of a polyimide-containing compound is formed by a plating treatment in the process shown in FIG. 15C. In the case of employing a plating treatment, it is possible to form easily an insulating film excellent in adhesivity without using an adhesive layer so as to simplify the manufacturing process.

FIGS. 16A to 16F are cross sectional views showing a method of manufacturing a circuit board according to another modification of the third embodiment of the present invention.

Figure 16A:
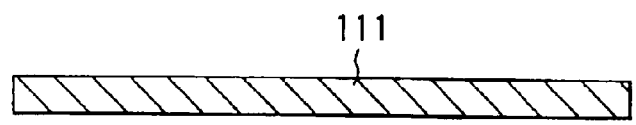
FIGS. 16A to 16F are cross sectional views collectively showing a process of manufacturing a circuit board according to another modification of the third embodiment of the present invention.
Figure 16B:
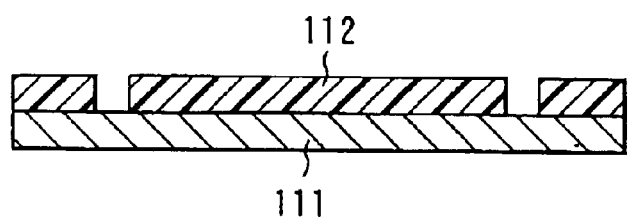
Figure 16C:
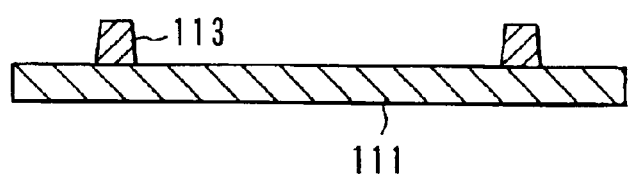

In the first step, a copper foil 111 is prepared, as shown in FIG. 16A, followed by forming a resist pattern 112 having an opening corresponding to a plug formed in the subsequent step on the copper foil 111, as shown in FIG. 16B. In the next step, a copper plug 113 is selectively formed within the opening of the resist pattern 112 by an electroplating method, followed by removing the resist pattern 112, as shown in FIG. 16C.

Figure 16D:
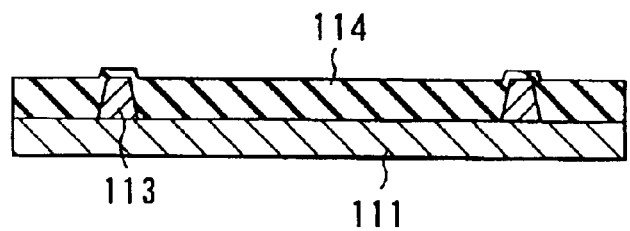
Figure 16E:
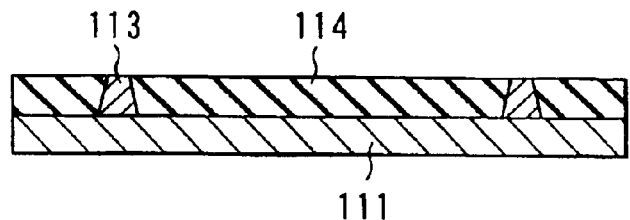

In the next step, an insulating film 114 consisting of a polyimide-containing compound is formed by a plating treatment as in the process shown in FIG. 15, as shown in FIG. 16D. Then, a planarizing treatment is applied by using, for example, a CMP treatment so as to obtain a structure that a plug 113 is formed within the insulating film 114, as shown in FIG. 16E.

Figure 16F:
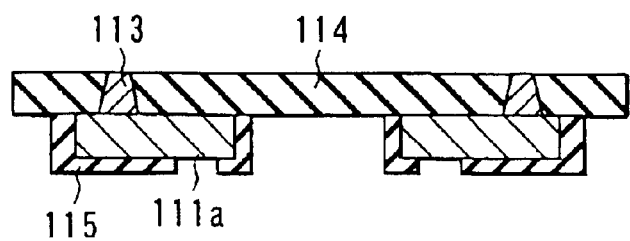

Then, a resist pattern (not shown) is formed on the copper foil 111, followed by etching the copper foil 111 by using the resist pattern as a mask so as to form a circuit pattern 111a consisting of a wiring, etc. After removal of the resist pattern, a pattern of a solder resist 115 is formed on the circuit pattern 111a so as to obtain a circuit board as shown in FIG. 16F.

According to this modification, the plug 113 is selectively formed within the opening of the resist pattern 112 by an electroplating method. As a result, the manufacturing process can be simplified. At the same time, the bonding strength of the plug 113 can be improved.

FIGS. 17A to 17F are cross sectional views collectively showing a method of manufacturing a circuit board according to another modification of the third embodiment of the present invention.

Figure 17A:
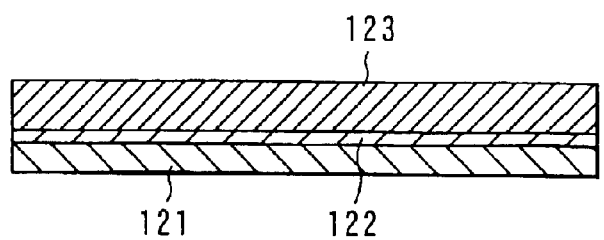
FIGS. 17A to 17F are cross sectional views collectively showing a process of manufacturing a circuit board according to another modification of the third embodiment of the present invention.
Figure 17B:
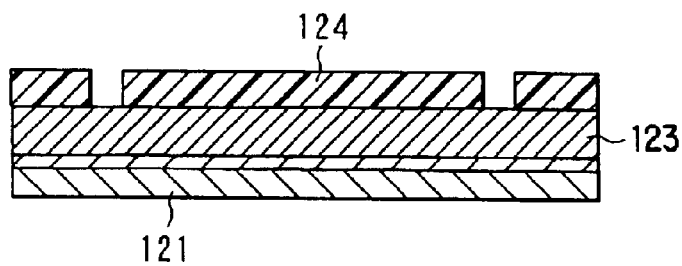
Figure 17C:
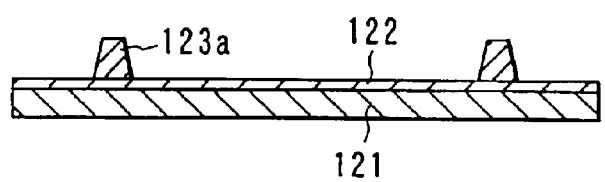

In the first step, a laminate foil consisting of a Cu layer 121, a TaN layer 122 and a Cu layer 123 is prepared, as shown in FIG. 17A, followed by forming a resist pattern 124 having an opening corresponding to a plug formed in a subsequent step on the Cu layer 123, as shown in FIG. 17B. Then, a Cu plug 123a is formed by etching the Cu layer 123 by using the resist pattern 124 as a mask. In this etching step, the TaN layer 122 functions as a stopper. Further, the resist pattern 124 is removed so as to obtain a structure as shown in FIG. 17C.

Figure 17D:
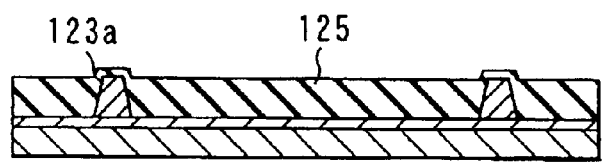
Figure 17E:
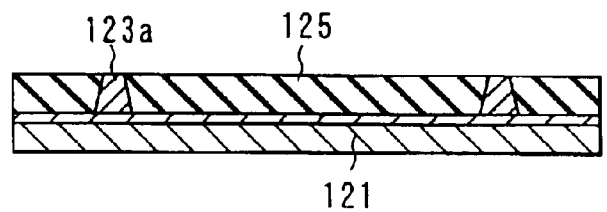

In the next step, an insulating film 125 consisting of a polyimide-containing compound is formed by a plating treatment as in the process shown in FIG. 15, as shown in FIG. 17D, followed by applying a planarizing treatment by, for example, CMP so as to obtain a structure that a plug 123a is formed within the insulating layer 125, as shown in FIG. 17E.

Figure 17F:
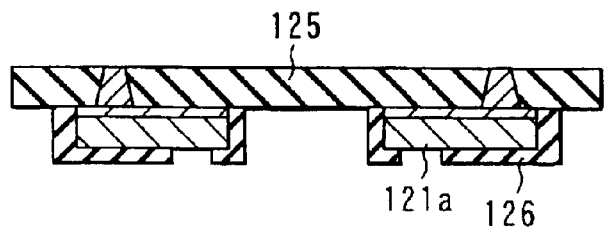

In the subsequent step, a resist pattern (not shown) is formed on the Cu layer 121, followed by etching the Cu layer 121 by using the resist pattern as a mask so as to form a circuit pattern 121a made of a wiring, etc. After removal of the resist pattern, a pattern of a solder resist 126 is formed on the circuit pattern 121a so as to obtain a circuit board as shown in FIG. 17F.

FIGS. 18A to 18F are cross sectional views collectively showing a method of manufacturing a circuit board according to another modification of the third embodiment of the present invention.

Figure 18A:
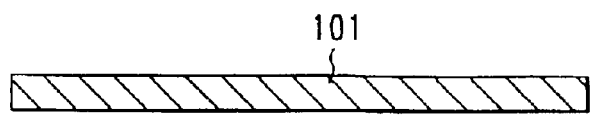
FIGS. 18A to 18F are cross sectional views collectively showing a process of manufacturing a circuit board according to another modification of the third embodiment of the present invention.
Figure 18B:
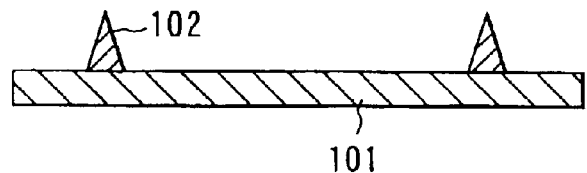
Figure 18C:
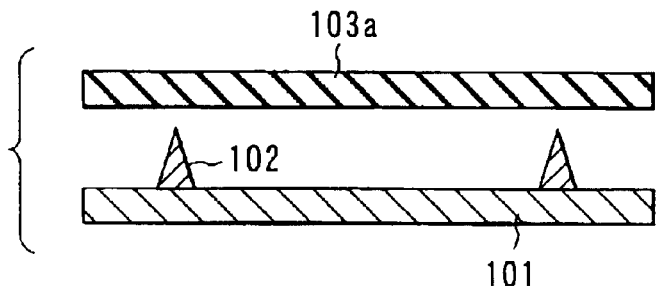
Figure 18D:
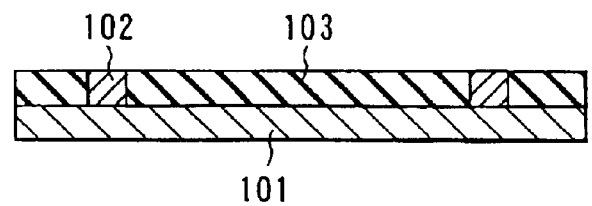
Figure 18E:
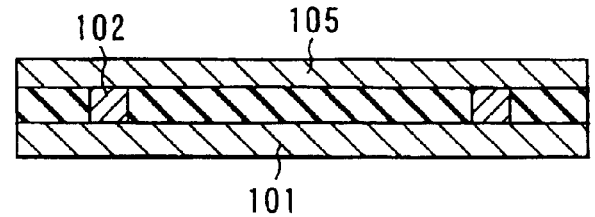
Figure 18F:
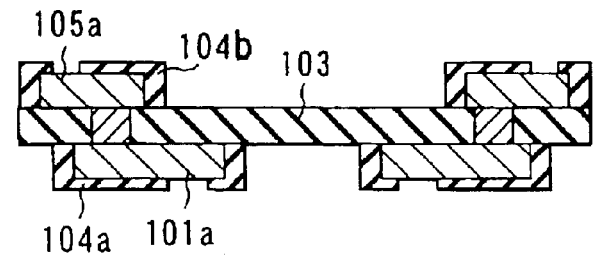

The process shown in FIGS. 18A to 18D is equal to the process shown in FIGS. 13A to 13D. In the modification shown in FIGS. 18A to 18F, a copper foil 105 is bonded by a thermal contact bonding to that surface of the insulating film 103 which is opposite the surface on which the copper foil 101 is formed after the step shown in FIG. 18D, as shown in FIG. 18E. Then, a resist pattern (not shown) is formed on the surface of each of the copper foil 101 and the copper foil 105, followed by etching the copper foil 101 and the copper foil 105 by using these resist patterns as masks so as to form circuit patterns 101a and 105a each consisting of a wiring, etc. After removal of the resist patterns, patterns of solder resist 104a and 104b are formed on the circuit patterns 101a and 105a so as to obtain a circuit board as shown in FIG. 18F.

FIGS. 19A to 19F are cross sectional views collectively showing a method of manufacturing a circuit board according to another modification of the third embodiment of the present invention.

Figure 19A:
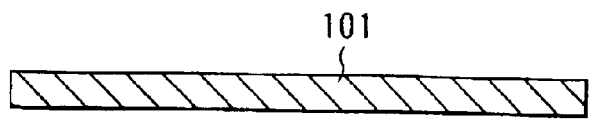
FIGS. 19A to 19F are cross sectional views collectively showing a process of manufacturing a circuit board according to another modification of the third embodiment of the present invention.
Figure 19B:
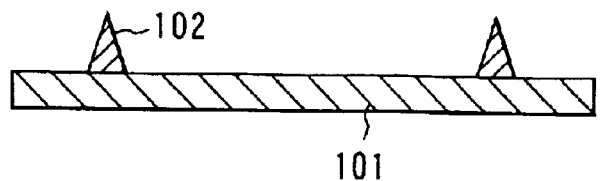
Figure 19C:
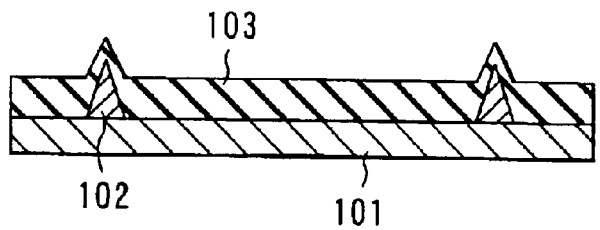
Figure 19D:
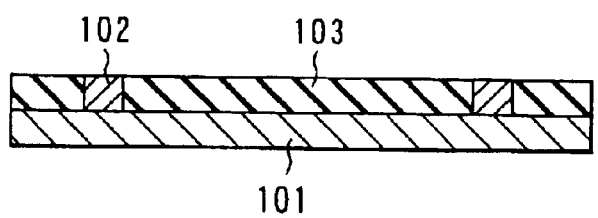
Figure 19E:
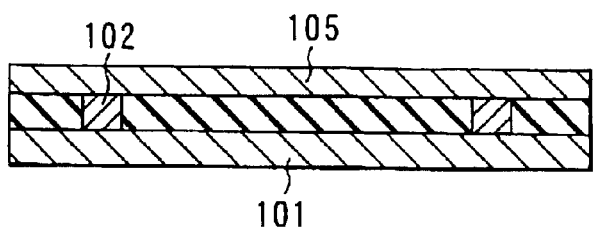
Figure 19F:
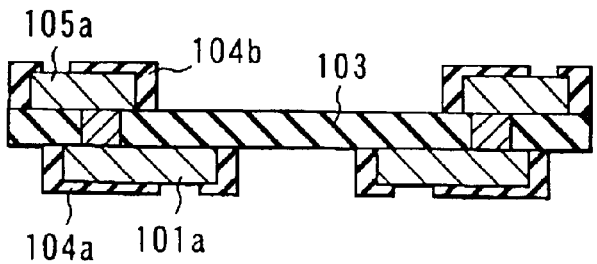

The process shown in FIGS. 19A to 19D is equal to the process shown in FIGS. 15A to 15D. Also, the subsequent process shown in FIGS. 19E and 19F is equal to the process shown in FIGS. 18E and 18F. Therefore, the detailed description of this modification is omitted.

FIGS. 20A to 20F are cross sectional views collectively showing a method of manufacturing a circuit board according to another modification of the third embodiment of the present invention.

Figure 20A:
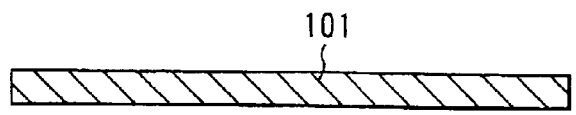
FIGS. 20A to 20F are cross sectional views collectively showing a process of manufacturing a circuit board according to another modification of the third embodiment of the present invention.
Figure 20B:
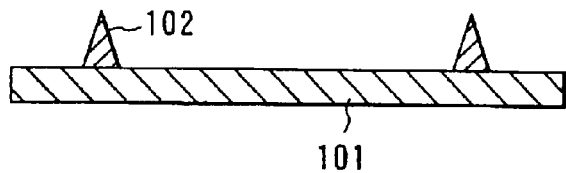
Figure 20C:
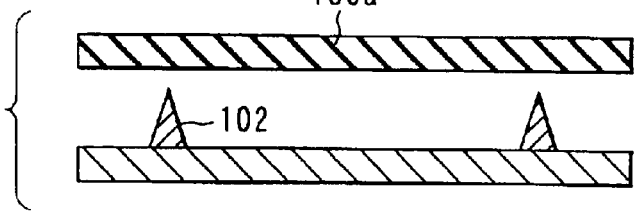
Figure 20D:
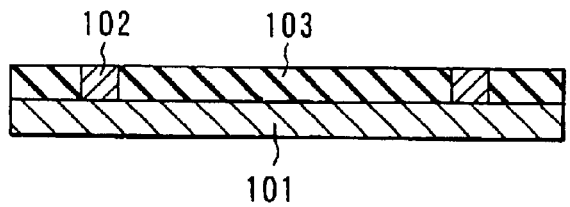
Figure 20E:
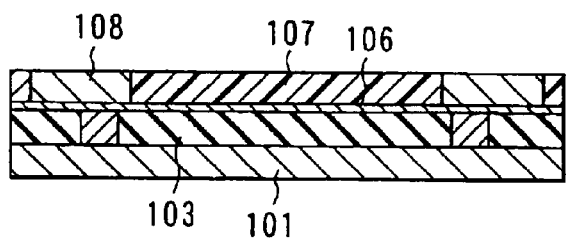

The process shown in FIGS. 20A to 20D is equal to the process shown in FIGS. 13A to 13D. In the modification shown in FIGS. 20A to 20F, a Cu seed layer 106 is formed after the process shown in FIG. 20D, as shown in FIG. 20E. Then, a resist pattern 107 having an opening corresponding to the circuit pattern is formed, followed by selectively forming a Cu layer 108 (circuit pattern 108a) within the opening by an electroplating method.

Figure 20F:
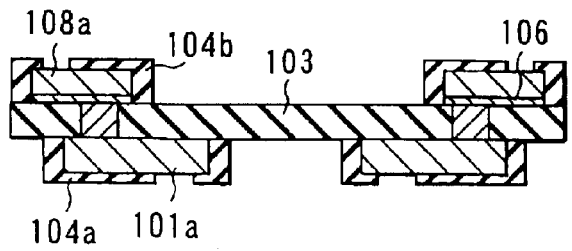

After removal of the resist pattern 107 and the seed layer 106, a resist pattern (not shown) is formed on the copper foil 101. The copper foil 101 is etched by using the resist pattern as a mask so as to form the circuit pattern 101a consisting of a wiring, etc. After removal of the resist pattern, patterns of solder resist 104a and 104b are formed on the circuit patterns 101a and 108a, respectively, so as to obtain a circuit board as shown in FIG. 20F.

Figure 21A:
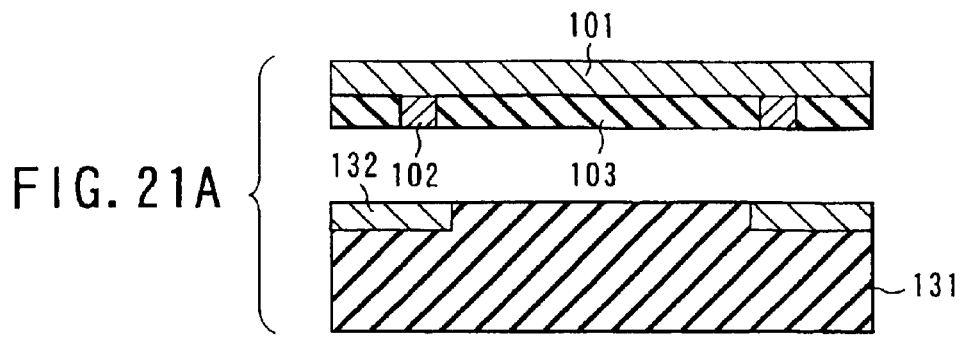
FIGS. 21A to 21C are cross sectional views collectively showing a process of manufacturing a circuit board according to another modification of the third embodiment of the present invention.
Figure 21B:
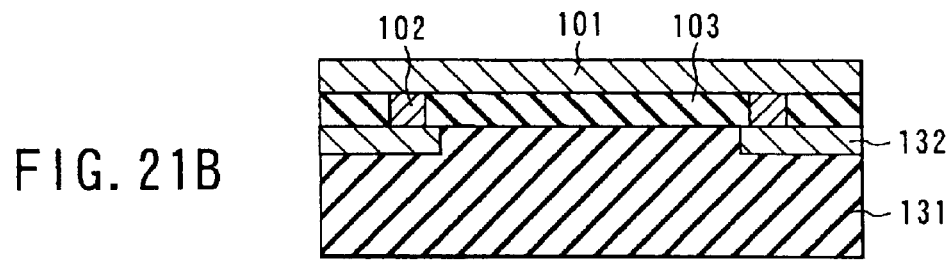
Figure 21C:
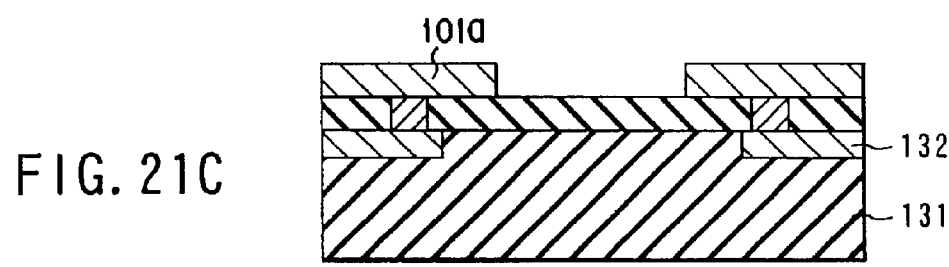

FIGS. 21A to 21C are cross sectional views collectively showing a method of manufacturing a circuit board according to another modification of the third embodiment of the present invention.

In the first step, two substrates, which are to be bonded to each other, are prepared as shown in FIG. 21A. One substrate, which is prepared by the method shown in FIG. 13 or 15, is constructed such that the plug 102 is formed within the insulating film 103 positioned on the copper foil 101. The other substrate is a printed substrate or a packaged substrate constructed such that a circuit pattern 132 is formed on a core substrate 131 made of, for example, a glass epoxy. As shown in FIG. 21B, these two substrates are bonded to each other. Further, a resist pattern (not shown) is formed on the copper foil 101, and the copper foil 101 is etched by using the resist pattern as a mask so as to form the circuit pattern 101a. As a result, obtained is a circuit board in which the circuit pattern 132 is connected to the circuit pattern 101a via the plug 102 as shown in FIG. 21C.

Figure 22A:
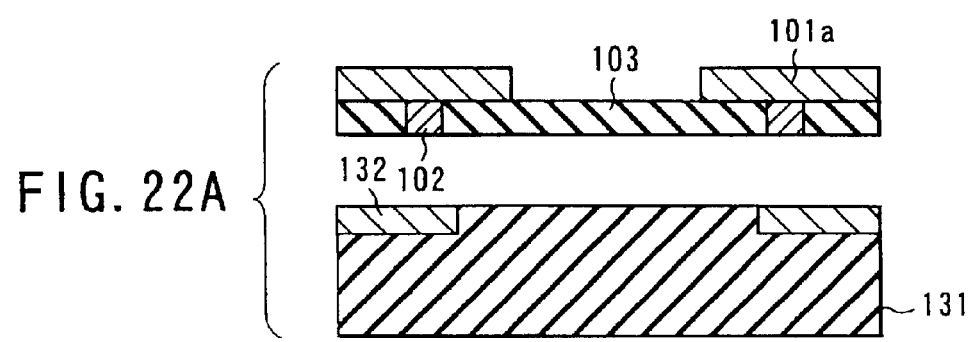
FIGS. 22A and 22B are cross sectional views collectively showing a process of manufacturing a circuit board according to still another modification of the third embodiment of the present invention.
Figure 22B:
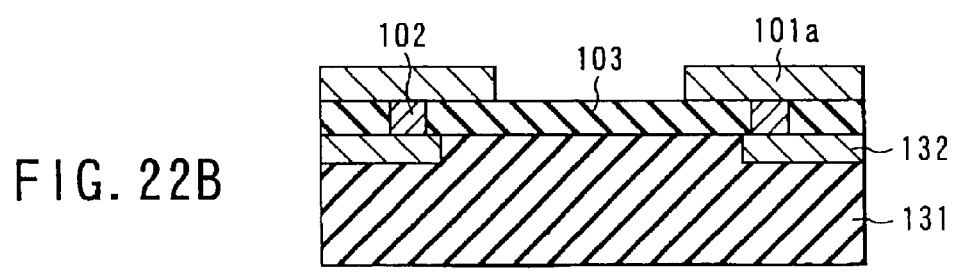

FIGS. 22A and 22B are cross sectional views collectively showing a method of manufacturing a circuit board according to still another modification of the third embodiment of the present invention.

In the modification shown in FIGS. 21A to 21C, the copper foil 101 is patterned after the two substrates are bonded to each other so as to form the circuit pattern 101a. In the modification shown in FIGS. 22A and 22B, however, the circuit pattern 101a is formed before the two substrates are bonded to each other, as shown in FIG. 22A. Then, the two substrates are bonded to each other so as to obtain a circuit board in which the circuit pattern 132 and the circuit pattern 101a are connected to each other via the plug 102.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an integrated circuit device, comprising:
    forming an active element on the side of one main surface of a first substrate;
    forming a passive element on the side of a first main surface of a second substrate; and
    allowing a second main surface opposite to the first main surface of the second substrate to face the main surface of the first substrate so as to allow the active element and the passive element to be electrically connected to each other via an electrode extending through the second substrate.

2. The method of manufacturing an integrated circuit device according to claim 1, wherein said passive element is an inductor.

3. The method of manufacturing an integrated circuit device according to claim 2, wherein said inductor is selectively formed by a plating treatment.

4. The method of manufacturing an integrated circuit device according to claim 2, wherein said inductor is formed by patterning a metal foil.

5. The method of manufacturing an integrated circuit device according to claim 1, wherein said second substrate is formed of a semiconductor substrate having a resistivity higher than a resistivity of a semiconductor substrate constituting said first substrate.

6. The method of manufacturing an integrated circuit device according to claim 1, wherein said second substrate is formed of an insulating substrate.

7. The method of manufacturing an integrated circuit device according to claim 1, wherein said electrode extending through the second substrate is formed by loading a conductive material in a connecting hole formed in the second substrate.

8. The method of manufacturing an integrated circuit device according to claim 1, wherein said electrode extending through the second substrate is a projection-like electrode formed on the side of the main surface of said first substrate.

9. The method of manufacturing an integrated circuit device according to claim 1, wherein allowing the active element and the passive element to be electrically connected to each other includes electrically connecting the electrode extending through the second substrate to the active element via a bump provided between then main surface of the first substrate and the second main surface of the second substrate.

10. The method of manufacturing an integrated circuit device according to claim 1, further comprising loading an insulating material between the main surface of the first substrate and the second main surface of the second substrate.

11. The method of manufacturing an integrated circuit device according to claim 1, wherein no passive element is formed on the side of the second main surface of the second substrate.

12. The method of manufacturing an integrated circuit device according to claim 1, wherein forming the passive element includes forming the passive element on the first main surface of the second substrate.

* * * * *

UNITED STATES PATENT AND TRADEMARK OFFICE
CERTIFICATE OF CORRECTION

PATENT NO. : 6,933,205 B2  Page 1 of 1
DATED : August 23, 2005
INVENTOR(S) : Matsuo et al.

It is certified that error appears in the above-identified patent and that said Letters Patent is hereby corrected as shown below:

<u>Column 18,</u>
Line 6, change "then" to -- the --.

Signed and Sealed this

First Day of November, 2005

JON W. DUDAS
*Director of the United States Patent and Trademark Office*